(12) United States Patent
Wiggin et al.

(10) Patent No.: US 6,337,576 B1
(45) Date of Patent: Jan. 8, 2002

(54) WAFER-LEVEL BURN-IN

(75) Inventors: Andrew K. Wiggin, Campbell; Allan Calamoneri, Danville; Martin P. Goetz, Discovery Bay; John Zasio, Sunnyvale; George E. Avery, Saratoga; Sammy K. Brown, Los Gatos, all of CA (US)

(73) Assignee: Alpine Microsystems, Inc., Campbell, CA (US)

( * ) Notice: Subject to any disclaimer, the term of this patent is extended or adjusted under 35 U.S.C. 154(b) by 0 days.

(21) Appl. No.: 09/357,481

(22) Filed: Jul. 19, 1999

(51) Int. Cl.[7] .............................. G01R 31/02; H05K 1/18
(52) U.S. Cl. ........................................ 324/763; 361/761
(58) Field of Search ................................. 324/760, 763, 324/765, 754, 755; 361/761, 764, 760

(56) References Cited

U.S. PATENT DOCUMENTS

| | | | |
|---|---|---|---|
| 5,138,427 A | 8/1992 | Furuyama | 327/68 |
| 5,397,997 A | 3/1995 | Tuckerman et al. | 324/754 |
| 5,483,175 A | 1/1996 | Ahmad et al. | 324/766 |
| 5,532,174 A | 7/1996 | Corrigan | 437/8 |
| 5,532,612 A | 7/1996 | Liang | 324/760 |
| 5,532,614 A | 7/1996 | Chiu | 324/763 |
| 5,539,325 A | 7/1996 | Rostoker et al. | 324/763 |
| 5,541,524 A | 7/1996 | Tuckerman et al. | 324/754 |
| 5,593,903 A | 1/1997 | Beckenbaugh et al. | 437/8 |
| 5,597,737 A | 1/1997 | Greer et al. | 437/8 |
| 5,696,404 A | 12/1997 | Murari et al. | 257/620 |
| 5,766,979 A | 6/1998 | Budnaitis | 438/15 |
| 5,830,565 A | 11/1998 | Budnaitis | 428/318.4 |
| 5,838,163 A | * 11/1998 | Rostoker et al. | 324/765 |
| 5,880,590 A | 3/1999 | Desai et al. | 324/757 |
| 5,994,912 A | * 11/1999 | Whetsel | 324/763 |

* cited by examiner

Primary Examiner—Safet Metjahic
Assistant Examiner—J Kerveros
(74) Attorney, Agent, or Firm—Kenneth C. Brooks

(57) ABSTRACT

A method and a system for wafer level burn-in testing of a circuit featuring a flip-jumper to permit selectively connecting signals to the interconnect sites on the wafer that are in constant electrical communication with the circuit.

26 Claims, 9 Drawing Sheets

WAFER-LEVEL BURN-IN

BACKGROUND OF THE INVENTION

The present invention relates to functional testing of integrated circuit to determine operational reliability. More particularly, the present invention is directed to a system and method of wafer-level functional testing of integrated circuits Reliability testing is employed to identify integrated circuits with undesirably short operational lives. It is well known that the greatest quantity of operational failures occurs within a few hours of operational testing. To identify integrated circuits with short operational lives, test signal patterns are applied to the integrated circuits to repeatedly stimulate all devices and wires in the circuit. Traditionally, the integrated circuits are mounted into single or multiple chip packages and may be mounted to an additional substrate, such as a printed circuit board. This is accomplished by segmenting the wafer in which the circuits are formed into individual chips or dies, i.e., the integrated circuits are diced from the wafer. The test signals are then applied to the integrated circuits via leads in the package or signal traces on the printed circuit board. To decrease the time required to test the circuits, testing is performed at elevated operational temperatures, referred to as burn-in testing. The elevated temperatures accelerate inchoate failures.

Nonetheless, burn-in testing has historically been time-consuming, leading to reduced integrated circuit throughput and increased costs of manufacturing reliable integrated circuits. One technique advanced to increase integrated circuit throughput employs printed circuits boards having multiple sockets adapted to receive and electrically couple the circuit to a source of test signals. This allows simultaneously testing a great quality of integrated circuits. With this process, however, the probability of processing bad or unreliable circuits before detecting defects is great.

Another burn-in technique for improving throughput is referred to as wafer level burn-in. The wafer level burn-in test involves testing whole, or parts of whole, wafers containing integrated circuits before segmenting the integrated circuits from the wafer. To that end, the wafer is manufactured with test points and a test apparatus is formed to contact the test points allowing test signals to propagate from a signal source through the test apparatus and onto the integrated circuits. The test points may be formed onto the integrated circuit itself, or disposed remotely with respect thereto to minimize the damage to the integrated circuit by the test apparatus. A drawback with prior art wafer level burn-in concerns mismatch between the coefficients of thermal expansion of the test apparatus and the wafer during burn-in, as well as the adverse effects of a defective test apparatus during burn-in. For example, it is often difficult to determine whether an integrated circuit identified as being defective is a result of a defect in the integrated circuit or a defective test apparatus, resulting in a entire wafer of operational integrated circuits being improperly discarded. In addition, a defective test apparatus can result in catastrophic failure rendering the entire wafer defective.

What is needed, therefore, is a burn-in testing technique that facilitates identifying defects attributable to a test apparatus from defects attributable to an integrated circuit, while avoiding the problems associated with catastrophic failures of a test apparatus.

SUMMARY OF THE INVENTION

A method and a system for wafer level burn-in testing of a circuit features flip-jumper to permit selectively connecting signals to the interconnect sites on the wafer that are in constant electrical communication with a region of the wafer. The method includes forming a plurality of interconnect sites, with a first subset of the interconnect sites are in constant signal communication with the region. The region may comprise of a circuit integrally formed with the wafer or an area of the wafer having bond sites to which a circuit may be mounted, thereby placing the circuit in constant communication with the first subset A second subset of the interconnect sites are selectively placed in data communication with the circuit by selectively placing the first and second subsets in signal communication. Signals are transmitted between the circuit and the signal source, with the signals selected from the group consisting of DC or AC signals. Specifically, the signal source is placed in data communication with one or more burn-in driver connections formed on the wafer to be in constant electrical communication with the second subset. The signal source is placed in electrical communication with the driver connections. Typically, the first and second subsets include multiple interconnect sites. The burn-in driver connections may be formed in a region of the wafer so as to bifurcate the same. However, to make efficient use of the surface area of the wafer, the driver connections may be formed on the periphery of the wafer, thereby being disposed radially symmetrically about the circuit.

Preferably, a plurality of circuits are formed on the semiconductor wafer and the interconnect sites are arranged in multiple sets. Each of the multiple sets is associated with one or more of the plurality of circuits and includes the first and second subsets. Typically, the circuits associated with one of the multiple sets differ from the circuits associated with the remaining sets of the multiple sets.

Selective communication between the first and second subsets is achieved by the flip-jumper. To that end, the flip-jumper includes connection pads configured to connect with the second subsets. In this manner, the flip-jumper places the signal source in data communication with the circuit by selectively placing the first and second subsets in signal communication. The flip-jumper may be formed from virtually any material suitable for substrate manufacture, including printed circuit board material or semiconductor material. One or more electronic elements are disposed between pairs of the connection pads. The electronic elements are connected in series between one of the interconnects of the first subset and one of the interconnects of the second subset upon the flip-jumper reaching a final seating position with respect to the semiconductor wafer. The electronic elements are selected from the group consisting of a wire, fuse, a resistor, a capacitor and a transistor. Although the flip-jumper may connect to all of the interconnect sites on the wafer, it is preferred that the flip-jumper connect with segments of the plurality of interconnect sites. In this fashion, multiple flip-jumpers may be employed to connect the plurality of circuits to the signal source. This permits segmenting the wafer into various test areas which increases the operational reliability of the wafer during burn-in testing.

DESCRIPTION OF THE SPECIFIC EMBODIMENTS

Figure 1:
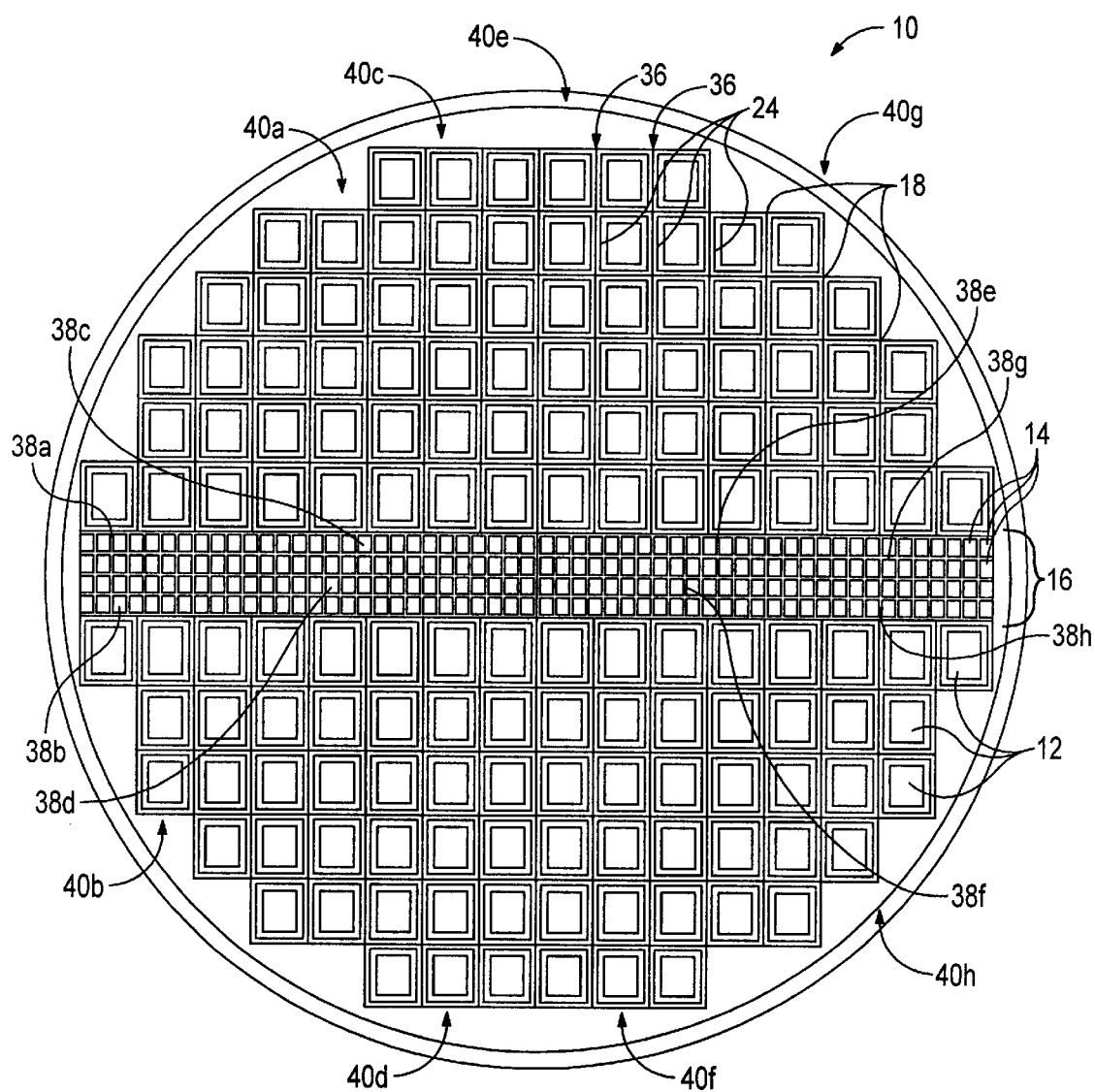
FIG. 1 is a top down view of a semiconductor wafer formed in accordance with the present invention.

Referring to FIG. 1, a wafer 10 is shown having a plurality of circuits 12 formed thereon, along with a plurality of burn-in driver connections 14 disposed in region 16 which bifurcates the wafer 10. In electrical communication with both the burn-in driver connections 14 and circuits 12 are multiple signal paths 18. Each of the signal paths includes one or more signal lines 20, shown more clearly in FIG. 2. The signal lines 20 extend from one or more interconnect sites 22a or 22b and terminate at one or more of the burn-in driver connections 14. Specifically, interconnect sites 22a form a first subset of the interconnect sites and interconnect sites 22b form a second subset of interconnect sites.

Figure 2:
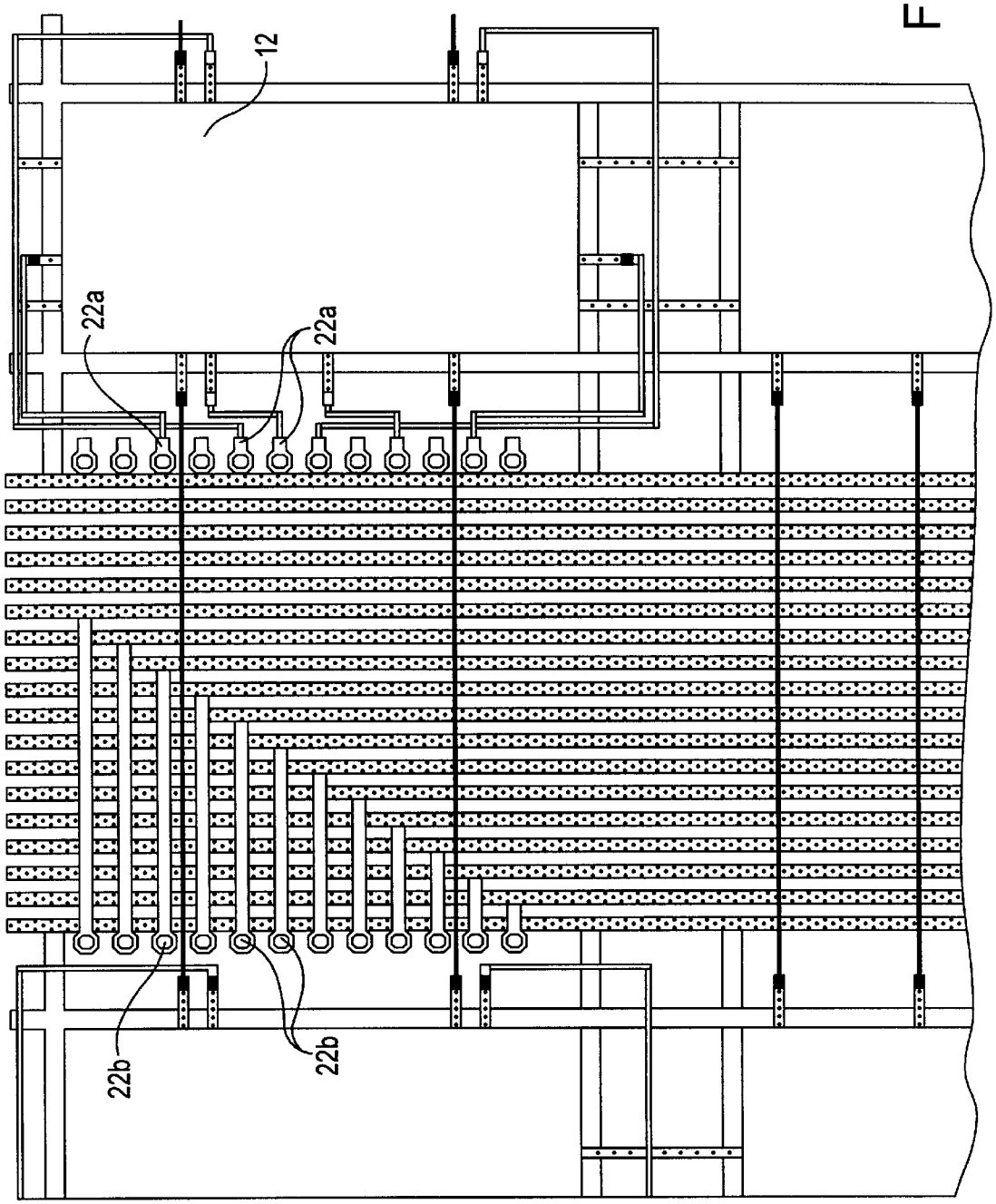
FIG. 2 is a detailed view of the semiconductor wafer shown above in FIG. 1.

Referring to both FIGS. 1 and 2, preferably, there are multiple sets 24 of interconnect sites, each of which is associated with one or more of the plurality of circuits 12 and includes the first and second subsets 22a and 22b. Typically, the circuits 12 associated with one of the multiple sets 24 differ from the circuits 12 associated with the remaining sets of the multiple sets 24. The first subset of interconnect sites 22a, of a given multiple set 24, are in constant signal communication with the circuit 12 associated therewith. The second subset 22b of the interconnect sites are electrically isolated from the first subset 22a and, therefore, from the circuit 12 associated therewith. As a result, signals applied to the burn-in driver connections are isolated from the circuit 12.

Figure 3:
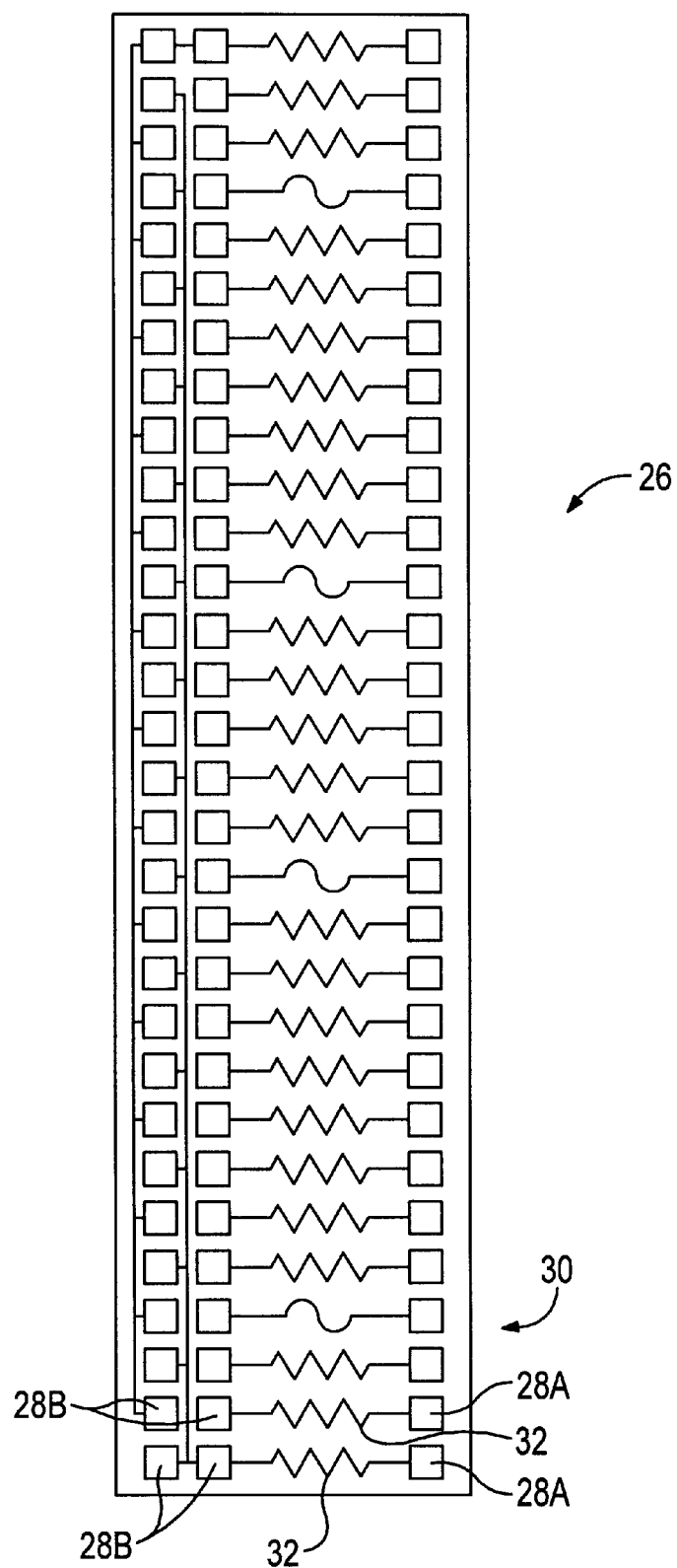
FIG. 3 is a plan view of a flip-jumper in accordance with the present invention.

Referring to FIGS. 2 and 3, the first and second subsets 22a and 22b may be the selectively placed in data communication by a flip-jumper 26. To that end, the flip-jumper 26 includes multiple connection pads 28a and 28b configured to connect with the first and second subsets 22a and 22b, respectively. Specifically, the flip-jumper 26 has one or more connection pad pairs 30 with each pair including one of the connection pads 28a and one of the connection pads 28b. Associated with one or more of the connection pad pairs 30 is an electronic element 32 connected in series between the connection pads 28a and 28b to provide the proper loading of the signal lines 20. To that end, the electronic element 32 associated with each connection pad pair 30 is dependent upon the application, but includes, among other things, the circuit 12 undergoing burn-in test and the functional tested desired. Typical examples of electronic element 32 include wires, resistors, capacitors, inductors, transistors and the like. Other electronic elements may include multi-component circuits, such as integrated circuits. In addition, the electronic element may include fuses, for example, on signal lines 20 that transmit bias voltages to the circuit.

Figure 4:
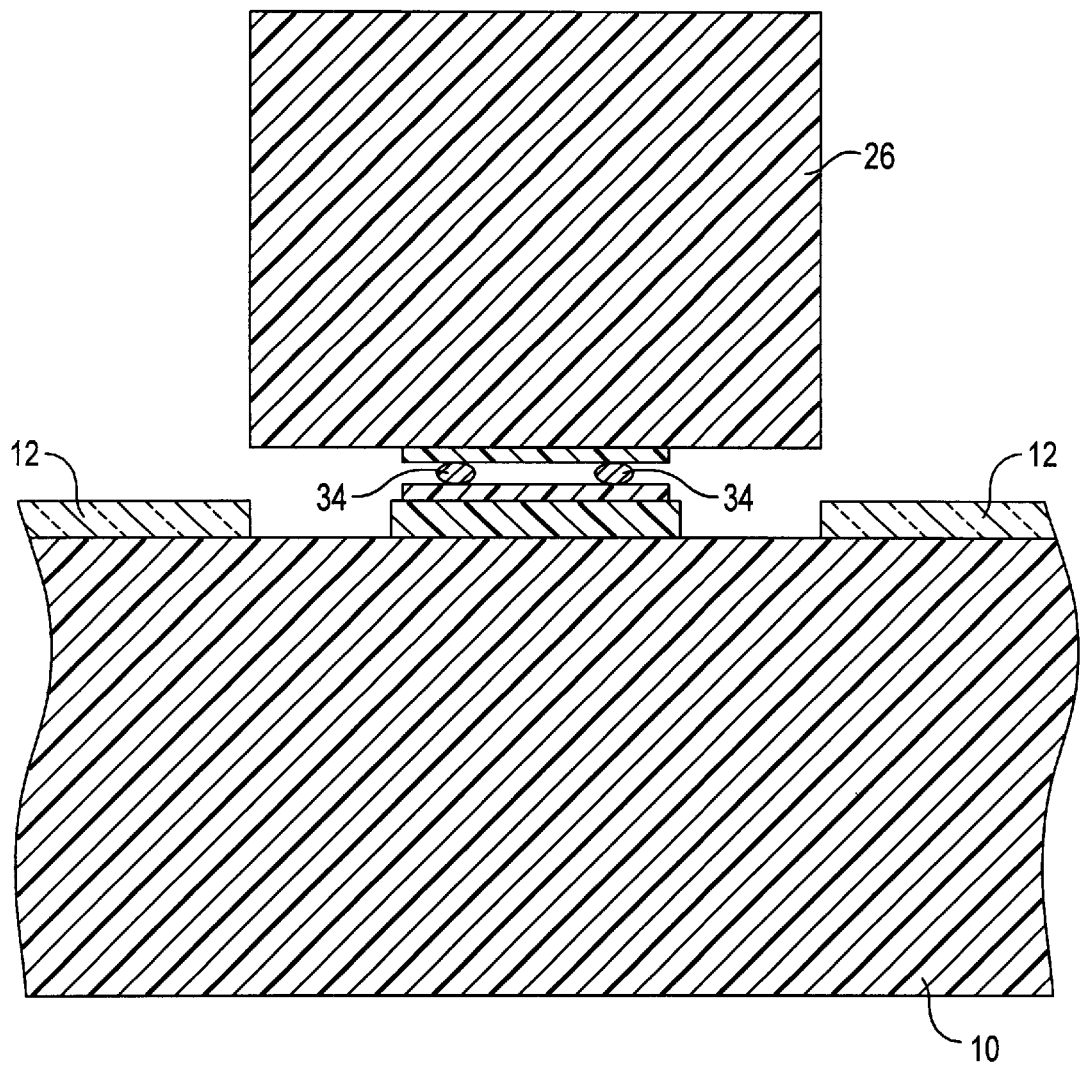
FIG. 4 is a cross-sectional view of the flip-jumper, shown above in FIG. 3, attached to the wafer, shown above in FIG. 1.
Figure 5:
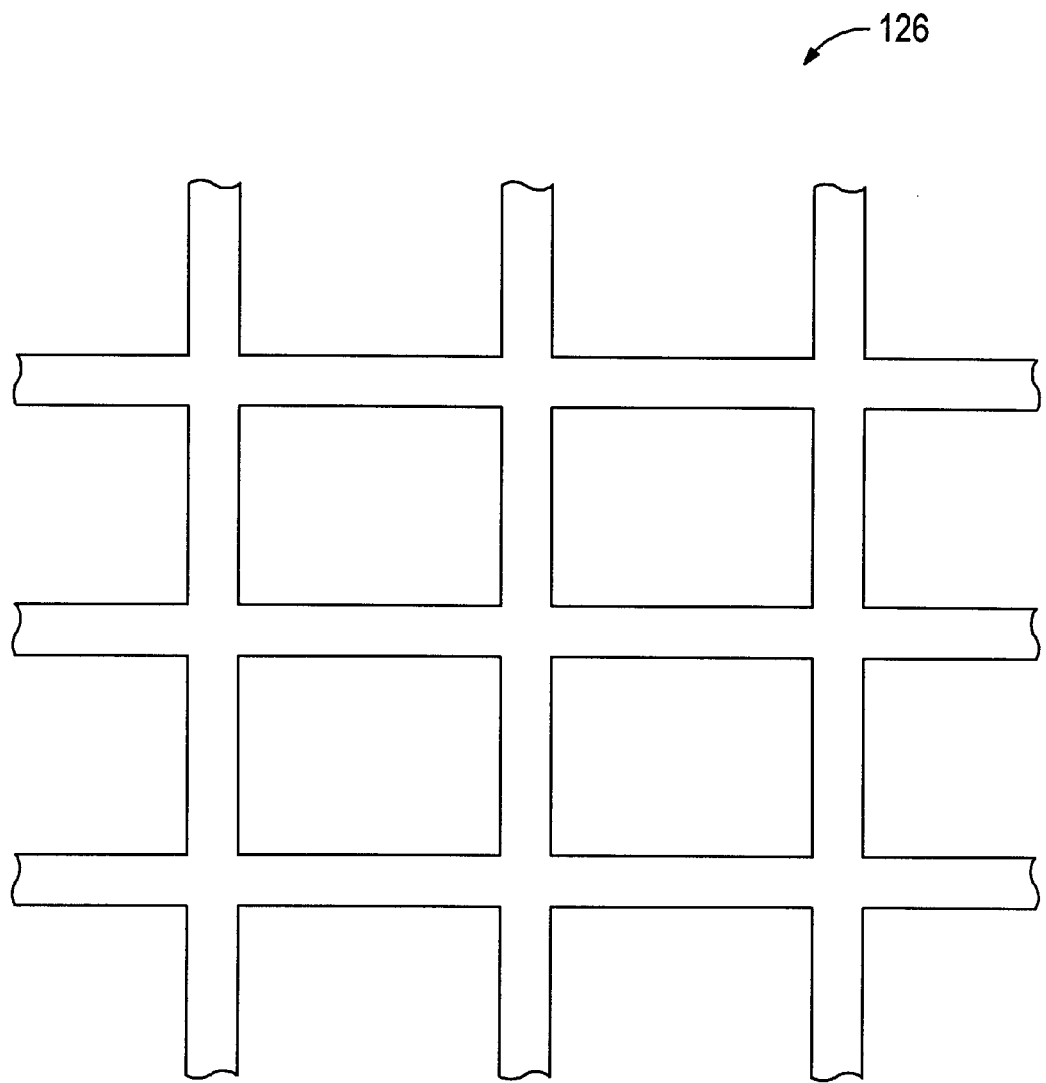
FIG. 5 is a plan view of an alternate embodiment of the flip-jumper shown above in FIG. 4.

Referring to FIGS. 1, 3 and 4, the flip-jumper 26 is attached to the wafer 10 via solder balls 34. More particularly, a solder ball 34 is disposed on the interconnect sites 22a and 22b and the connection pads 28a and 28b mate to the solder balls 34. Any number of flip-jumpers 26 may be employed to facilitate burn-in testing of the substrate. For example, a flip-jumper 26 may be employed to contact the requisite interconnect sites 22a and 22b of the multiple sets 24 in a particular row 36 so that all the circuits associated with a row 36 are tested. Alternatively, for example, a flip-jumper 126, shown in FIG. 5, may have a matrix configuration so that it may contact the requisite interconnect sites 22a and 22b of all of the multiple sets 24 associated with the circuits 12 undergoing burn-in testing.

It is preferred, however, that each circuit 12 have a flip-jumper 26 uniquely associated therewith. In this manner, each flip-jumper 26 associated with one of the plurality of circuits 12 differs from the flip-jumpers 26 associated with the remaining circuits of the plurality of circuits 12. The benefits of this structure are manifold. Were one of the plurality of circuits 12 to experience a catastrophic failure, it could be electrically decoupled from the burn-in test by removing the flip-jumper 26 associated with it. This operation also facilitates fault isolation. By interchanging two flip-jumpers 26, one from a properly functioning circuit 12 and one from an improperly functioning circuit 12, discriminating between the flip-jumper 26 and the improperly functioning circuit as the cause of a malfunction is facilitated.

Additional benefits are derived from the present invention by associating subgroups 38a, 38b, 38c, 38d, 38e, 38f, 38g and 38h of the burn-in driver connections 14 with one or more of the plurality of circuits 12, referred to as clusters 40a, 40b, 40c, 40d, 40e, 40f, 40g and 40h. It is preferred that the subgroup of burn-in drivers associated with one of the plurality of clusters differs from the burn-in drivers associated with the remaining clusters. To that end, subgroups 38a, 38b, 38c, 38d, 38e, 38f, 38g and 38h are uniquely associated with as clusters 40a, 40b, 40c, 40d, 40e, 40f, 40g and 40h, respectively. In this fashion, various operational difficulties may be avoided. For example, a common problem concerns powering-up the plurality of circuits 12, simultaneously. This results in a power spike being produced which may damage p-n junctions of the circuits and/or the power supply (not shown) used to bias the circuits 12. To avoid power spikes, biasing voltage is supplied separately to each subgroup of burn-in driver connections 14 to bias the cluster associated therewith. The bias voltage is then sequentially applied to each subgroup of burn-in driver connections. In addition, if an entire cluster of circuits is defective, the power to the same may be terminated without reducing the reliability of the burn-in test of the remaining clusters of circuits 12.

The wafer 10 is thermally compatible with the flip-jumper 26, which may be achieved by forming the same of materials with similar Coefficient of Thermal Expansion (CTE). In a preferred embodiment, wafer 10 and the flip-jumper 26 are made of the same material. Since wafers are typically manufactured from single crystal silicon, which has a relatively low CTE, silicon is the preferred flip-jumper 26 material. However, gallium arsenide or other materials with comparable CTE may also be utilized.

Figure 6:
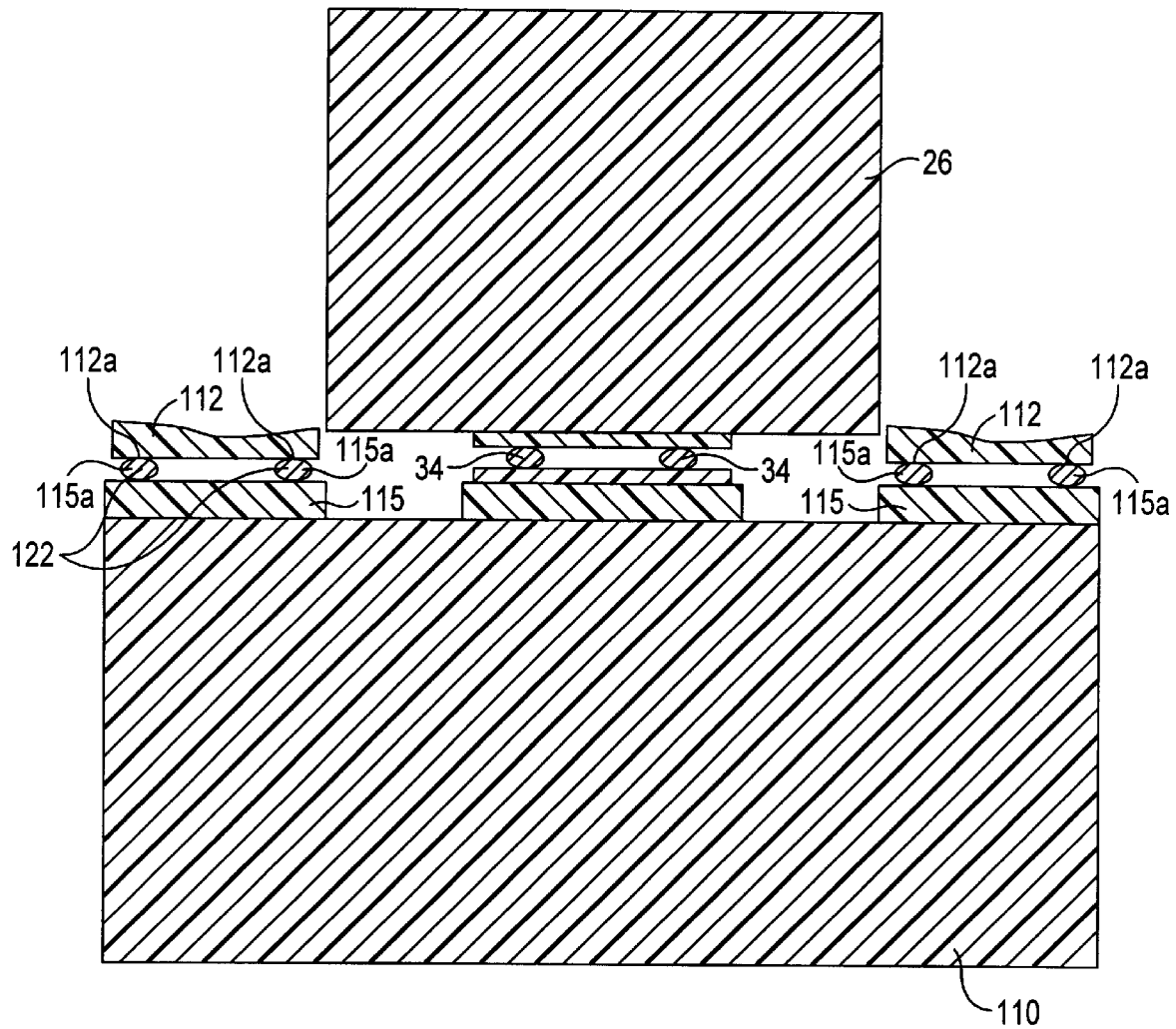
FIG. 6 is a cross-sectional view of an alternate embodiment of the flip-jumper, shown above in FIG. 4.
Figure 7:
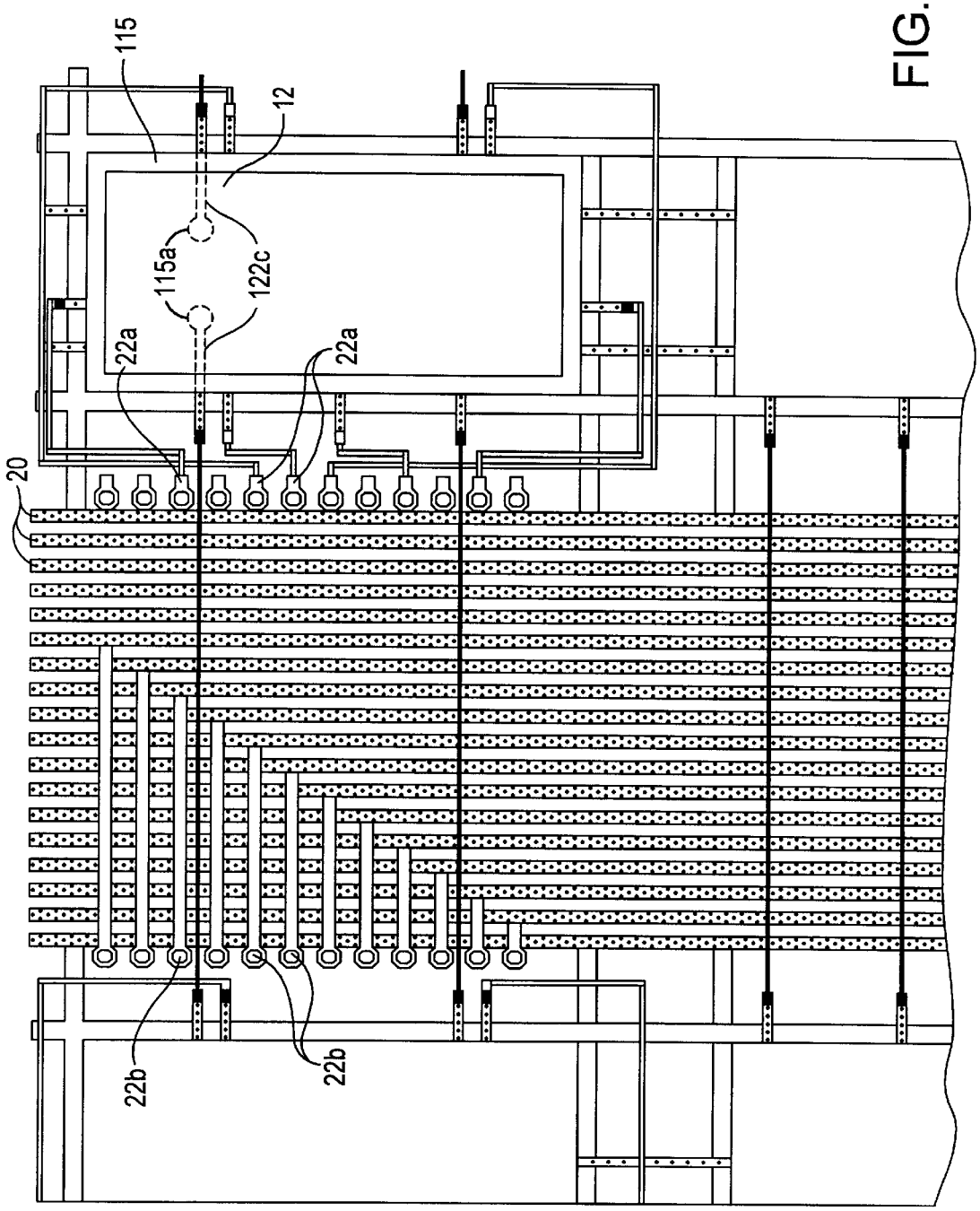
FIG. 7 is a detailed view of the semiconductor wafer shown above in FIG. 2 in accordance with an alternate embodiment.

The foregoing has been discussed with respect to circuit 12 being integral with the wafer 10, i.e., circuit 12 is formed on the wafer 12. However, as shown in FIG. 6, circuit 112 may be attached to wafer 110. The area of the wafer 110 to which the circuit 112 is attached is a carrier 115 or micropallet that is integral with the wafer 110. The carrier 115 includes one or more bonding sites 115a that is in electrical communication with one or more of the interconnect sites 122a via a signal trace 122c. The bonding sites 115a are also are in electrical communication with one or more of the bond pads 112a of the circuit 112 via a solder ball 122. In this manner, the carrier 115 places the circuit 112 in electrical communication with the interconnect sites 122a, shown in FIG. 7.

Figure 8:
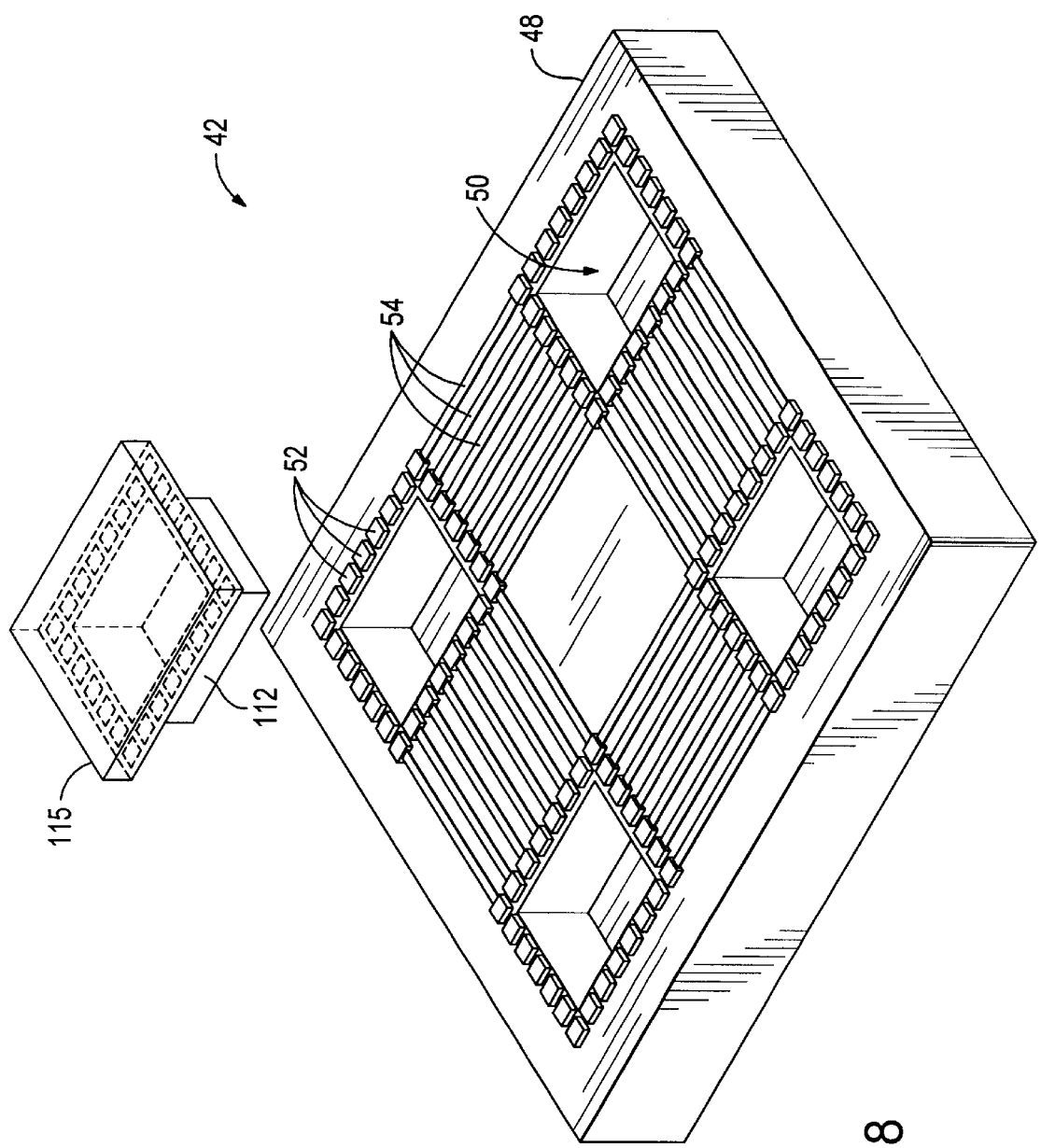
FIG. 8 is an exploded perspective view of a multi-chip module that may be formed in accordance with the present invention.

Referring to FIG. 8, in an exemplary embodiment, the circuit 112 and carrier 115 are used in a multi-chip module 42 that includes mounting of the carrier 115 to a board 48 having a plurality of openings 50, described in U.S. Pat. No. 6,128,201, which is incorporated by reference in its entirety. As described in the patent application, the board 48 has four openings 50, however, the number of openings 50 changes according to the number of carriers 46 to be connected to board 48.

Figure 9:
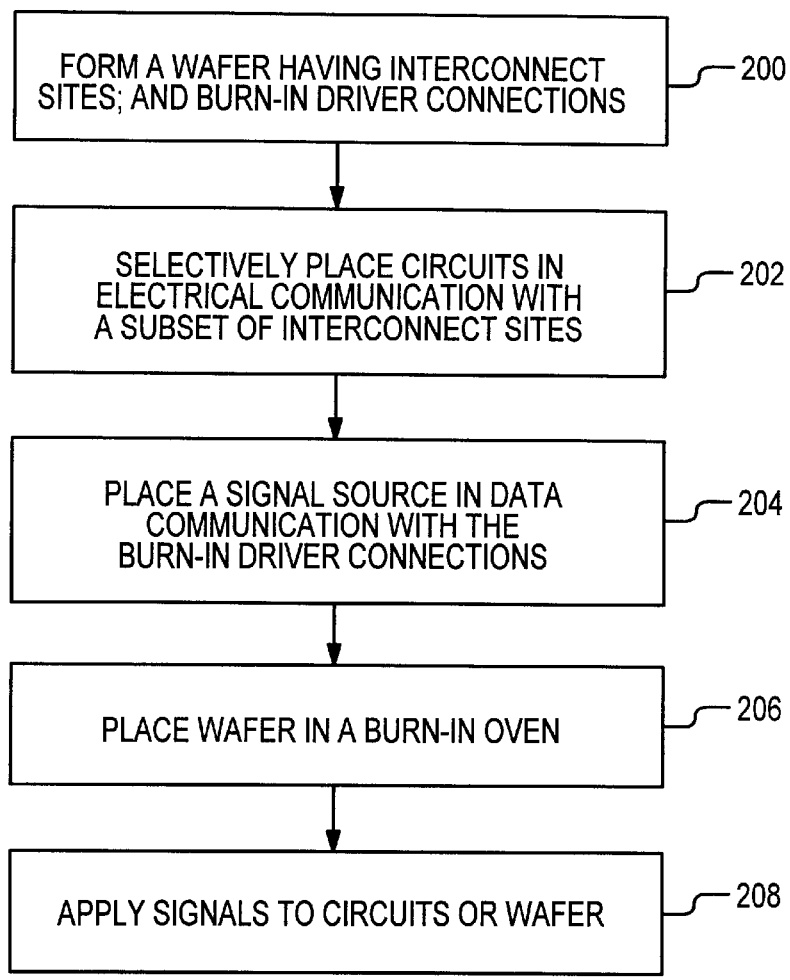
FIG. 9 is a block diagram showing the burn-in test method employing the wafer shown above in FIG. 1, in accordance with the present invention.
Figure 10:
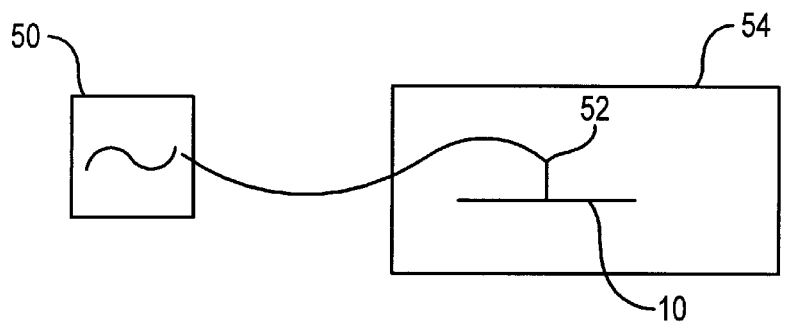
FIG. 10 is a block diagram showing an exemplary embodiment of a test apparatus used to practice the method shown above in FIG. 9.

FIG. 9 is a flowchart showing the preferred method of burn-in testing according to the present invention. Referring to FIGS. 1, 9 and 10, at step 200, the interconnect sites 22a and 22b and the burn-in driver connections 14 are formed on wafer 10, and a plurality of circuits are in electrical communication therewith. At step 202, flip-jumpers 26 are connected to the sets of 24 of interconnect sites 22a and 22b associated with the circuits 12 to undergo burn-in test. At step 204, a signal source 50 is place in data communication with the burn-in driver connections 14 via a connector 52. At step 206, the wafer 10, connector 52 and flip-jumpers 26 are placed into a temperature controlled environment, such as a burn-in oven 54, and heated to testing temperatures. At step 208, signals are applied to the circuits 12 and DC and AC signals.

It is to be understood that the above description is intended to be illustrative and not restrictive. Many embodiments will be apparent to those of skill in the art upon reviewing the above description. By way of example, the wafer 10, shown above in FIG. 1 may have the burn-in driver connections 14 disposed along the periphery of the wafer 10. Further, the burn-in driver connections may be disposed radially symmetrically about the plurality of circuits 12. Those skilled in the art will recognize other equivalent or alternative methods and configurations of arranging the circuits, interconnect sites 22a and 22b and burn-in driver interconnections 14, as well as other configurations for the flip-jumper 26, shown in FIG. 3. The scope of the invention should, therefore, be determined not with reference to the above description, but should instead be determined with reference to the appended claims, along with the full scope of equivalents to which such claims are entitled.

What is claimed is:

1. A method comprising:
    forming a plurality of interconnect sites on a wafer,
    forming a circuit on said wafer to be in constant signal communication with a first subset of said interconnect sites, with a second subset of said interconnect sites being electrically isolated with respect to both said first subset and said circuit;
    providing a substrate having a plurality of connection pads formed thereon with a first portion of said plurality of connections pads being in electrical communication with a second portion of said plurality of connection pads with a load connected therebetween; and
    coupling said substrate to said wafer to apply said load to said circuit by placing said first portion in electrical communication with said first subset and said second portion in electrical communication with said second subset.

2. The method as recited in claim 1 wherein each of said first and second subsets include multiple interconnect sites.

3. The method as recited in claim 1 further including placing a signal source in electrical communication with said second subset and transmitting between said signal source and said circuit, signals from said signal source, selected from the group consisting of DC or AC signals.

4. The method as recited in claim 1 further including forming a burn-in driver connection on said wafer in electrical communication with the interconnect sites of said second subset.

5. The method as recited in claim 1 further including forming a plurality of burn-in driver connections in a region so as to bifurcate said wafer.

6. The method as recited in claim 1 further including forming a plurality of burn-in driver connections, with said plurality of interconnect sites being formed to be disposed radially symmetrically about said circuit.

7. The method as recited in claim 1 wherein forming said circuit includes forming a plurality of circuits on said wafer and forming said plurality of interconnect sites includes forming multiple sets of said interconnect sites each of which is associated with one of said plurality of circuits and includes said first and second subsets.

8. The method as recited in claim 7 wherein each of said multiple sets are associated with a subgroup of said plurality of circuits.

9. The method as recited in claim 7 wherein each of said multiple sets are associated with a subgroup of said plurality of circuits, with the circuits associated with one of said multiple sets differing from the circuits associated with the remaining sets of said multiple sets.

10. The method as recited in claim 7 wherein each of said multiple sets are disposed proximate to one of said plurality of circuits associated therewith.

11. A method comprising:
    forming multiple sets of interconnect sites on a wafer,
    forming a plurality of circuits in signal communication with said multiple sets of interconnect sites, with each of said multiples sets being associated with a subgroup of said plurality of circuits and including first and second subsets of interconnect sites, with the first subset being in constant signal communication with said subgroup of said plurality of circuits; and
    providing a plurality of substrates, each of which has a plurality of connection pads formed thereon with a first portion of said plurality of connections pads being in electrical communication with a second portion of said connection pads with a load connected therebetween; and
    coupling said plurality of substrates to said wafer to apply said load associated with said plurality of substrates in electrical communication with said subgroup of said plurality of circuits by placing said first portion in electrical communication with said first subset and said second portion in electrical communication with said second subset.

12. The method as recited in claim 11 further including placing a signal source in electrical communication with said second subset and transmitting signals, from said signal source, between said signal source and said one of said plurality of circuits, with said signals being selected from the group consisting of DC and AC signals.

13. The method as recited in claim 11 further including forming a plurality of burn-in driver connections in electrical communication with the interconnect sites of said second subset, with said driver connections being formed in a region so as to bifurcate said wafer.

14. The method as recited in claim 11 further including forming a plurality of burn-in driver connections wherein said plurality of interconnect sites are formed to be disposed radially symmetrically about said plurality of circuits.

15. The method as recited in claim 11 wherein said subgroup includes one of said plurality of circuits.

16. The method as recited in claim 11 wherein said subgroup includes two of said plurality of circuits.

17. A system for testing a circuit, said system comprising:
   a semiconductor wafer having integrally formed thereon, a region in electrical communication with said circuit, a plurality of interconnect sites, arranged in first and second subsets, with said first subset being in constant signal communication with said region; and
   a substrate having a plurality of connection pads thereon, a first portion of said plurality of connections pads being in electrical communication with a second portion of said plurality of connection pads with a load connected therebetween, with said first portion being in electrical communication with said first subset and said second portion being in electrical communication with said second subset to couple said load to said circuit.

18. The system as recited in claim 17 further including a signal source in electrical communication with said second subset.

19. The system as recited in claim 17 wherein said load includes a plurality of electronic elements.

20. The system as recited in claim 17 wherein said semiconductor wafer includes a plurality of circuits, with said plurality of said interconnect sites arranged in multiple sets, each of which is associated with one of said plurality of circuits being and includes said first and second subsets.

21. The system as recited in claim 20 wherein each of said multiple sets are associated with a subgroup of said plurality of circuits.

22. The system as recited in claim 20 wherein each of said multiple sets are associated with a subgroup of said plurality of circuits, with the circuits associated with one of said multiple sets differing from the circuits associated with the remaining sets of said multiple sets.

23. The system as recited in claim as recited in claim 17 wherein each of said first and second subsets include multiple interconnect sites.

24. The system as recited in claim 17 wherein said semiconductor wafer includes a plurality of burn-in driver connections in constant electrical communication with said second subset.

25. The system as recited in method as recited in claim 24 wherein said plurality of burn-in driver connections are arranged in a region bifurcating said semiconductor wafer.

26. The system as recited in claim 24 wherein said plurality of burn-in driver connections are disposed radially symmetrically about said circuit.

\* \* \* \* \*

UNITED STATES PATENT AND TRADEMARK OFFICE
CERTIFICATE OF CORRECTION

PATENT NO. : 6,337,576 B1  Page 1 of 1
APPLICATION NO. : 09/357481
DATED : January 8, 2002
INVENTOR(S) : Wiggin et al.

It is certified that error appears in the above-identified patent and that said Letters Patent is hereby corrected as shown below:

Col. 1, line 4 please cancel "circuit" and insert --circuits-- in place thereof.

Col. 1, line 7 please cancel "circuits" and insert --circuits.-- in place thereof.

Col. 2, line 4 please cancel "are" and insert --being-- in place thereof.

Col. 2, line 38 please cancel "with the second subsets." and insert --with the first and second subsets.-- in place thereof.

Col. 3, line 52 please cancel "the".

Col. 7, line 21 please cancel "connections" and insert --connection-- in place thereof.

Signed and Sealed this

Fifteenth Day of July, 2008

JON W. DUDAS
*Director of the United States Patent and Trademark Office*